(12) United States Patent
Biard et al.

(10) Patent No.: US 7,065,124 B2
(45) Date of Patent: Jun. 20, 2006

(54) ELECTRON AFFINITY ENGINEERED VCSELS

(75) Inventors: James R. Biard, Richardson, TX (US); Ralph H. Johnson, Murphy, TX (US); Klein L. Johnson, Orono, MN (US)

(73) Assignee: FinLsar Corporation, Sunnyvale, CA (US)

( * ) Notice: Subject to any disclaimer, the term of this patent is extended or adjusted under 35 U.S.C. 154(b) by 104 days.

(21) Appl. No.: 10/767,920

(22) Filed: Jan. 29, 2004

(65) Prior Publication Data

US 2005/0031011 A1    Feb. 10, 2005

Related U.S. Application Data

(63) Continuation-in-part of application No. 09/724,820, filed on Nov. 28, 2000, now Pat. No. 6,905,900, and a continuation-in-part of application No. 10/283,381, filed on Oct. 28, 2002, now Pat. No. 6,990,135.

(51) Int. Cl.
*H01S 3/08* (2006.01)
*H01S 5/00* (2006.01)

(52) U.S. Cl. ......................... 372/99; 372/50.1
(58) Field of Classification Search ............ 372/99, 372/50.1
See application file for complete search history.

(56) References Cited

U.S. PATENT DOCUMENTS

| 4,317,085 A | 2/1982 | Burnham et al. |
| 4,466,694 A | 8/1984 | MacDonald |
| 4,660,207 A | 4/1987 | Svilans |
| 4,675,058 A | 6/1987 | Plaster |
| 4,784,722 A | 11/1988 | Liau et al. |
| 4,885,592 A | 12/1989 | Kofol et al. |
| 4,901,327 A | 2/1990 | Bradley |
| 4,943,970 A | 7/1990 | Bradley |
| 4,956,844 A | 9/1990 | Goodhue et al. |
| 5,031,187 A | 7/1991 | Orenstein et al. |
| 5,052,016 A | 9/1991 | Mahbobzadeh |
| 5,056,098 A | 10/1991 | Anthony et al. |

(Continued)

FOREIGN PATENT DOCUMENTS

DE    4240706 A1    6/1994

(Continued)

OTHER PUBLICATIONS

Banwell et al., "VCSE Laser Transmitters for Parallel Data Links", *IEEE Journal of Quantum Electronics*, vol. 29, No. 2, Feb. 1993, pp. 635-644.

(Continued)

*Primary Examiner*—James Menefee
(74) *Attorney, Agent, or Firm*—Workman Nydegger

(57) ABSTRACT

A VCSEL having an N-type Bragg mirror with alternating layers of high bandgap (low index) and low bandgap (high index) layers of AlGaAs. The layers may be separated by a step change of Al composition followed by a graded region, and vice versa for the next layer, in the N-type mirror to result in a lower and more linear series resistance. Also, an N-type spacer layer may be adjacent to an active region of quantum wells. There may be a similar step in a change of Al composition from the nearest layer of the N-type mirror to the N-type spacer formed from a lower bandgap direct AlGaAs layer to provide lower free carrier absorption. With electron affinity engineering, a minority carrier hole barrier may be inserted adjacent to the quantum wells to improve hole confinement at high current density and high temperature.

38 Claims, 6 Drawing Sheets

U.S. PATENT DOCUMENTS

| | | |
|---|---|---|
| 5,062,115 A | 10/1991 | Thornton |
| 5,068,869 A | 11/1991 | Wang et al. |
| 5,079,774 A | 1/1992 | Mendez et al. |
| 5,115,442 A | 5/1992 | Lee et al. |
| 5,117,469 A | 5/1992 | Cheung et al. |
| 5,140,605 A | 8/1992 | Paoli et al. |
| 5,157,537 A | 10/1992 | Rosenblatt et al. |
| 5,158,908 A | 10/1992 | Blonder et al. |
| 5,212,706 A | 5/1993 | Jain |
| 5,216,263 A | 6/1993 | Paoli |
| 5,216,680 A | 6/1993 | Magnusson et al. |
| 5,237,581 A | 8/1993 | Asada et al. |
| 5,245,622 A | 9/1993 | Jewell et al. |
| 5,258,990 A | 11/1993 | Olbright et al. |
| 5,262,360 A | 11/1993 | Holonyak, Jr. et al. |
| 5,285,466 A | 2/1994 | Tabatabaie |
| 5,293,392 A | 3/1994 | Shieh et al. |
| 5,317,170 A | 5/1994 | Paoli |
| 5,317,587 A | 5/1994 | Ackley et al. |
| 5,325,386 A | 6/1994 | Jewell et al. |
| 5,331,654 A | 7/1994 | Jewell et al. |
| 5,337,074 A | 8/1994 | Thornton |
| 5,337,183 A | 8/1994 | Rosenblatt et al. |
| 5,349,599 A | 9/1994 | Larkins |
| 5,351,256 A | 9/1994 | Schneider et al. |
| 5,359,447 A | 10/1994 | Hahn et al. |
| 5,359,618 A | 10/1994 | Lebby et al. |
| 5,363,397 A | 11/1994 | Collins et al. |
| 5,373,520 A | 12/1994 | Shoji et al. |
| 5,373,522 A | 12/1994 | Holonyak, Jr. et al. |
| 5,376,580 A | 12/1994 | Kish et al. |
| 5,386,426 A | 1/1995 | Stephens |
| 5,390,209 A | 2/1995 | Vakhshoori |
| 5,396,508 A | 3/1995 | Bour et al. |
| 5,404,373 A | 4/1995 | Cheng |
| 5,412,678 A | 5/1995 | Treat et al. |
| 5,412,680 A | 5/1995 | Swirhum et al. |
| 5,416,044 A | 5/1995 | Chino et al. |
| 5,428,634 A | 6/1995 | Bryan et al. |
| 5,438,584 A | 8/1995 | Paoli et al. |
| 5,446,754 A | 8/1995 | Jewell et al. |
| 5,465,263 A | 11/1995 | Bour et al. |
| 5,475,701 A | 12/1995 | Hibbs-Brenner |
| 5,493,577 A | 2/1996 | Choquette et al. |
| 5,497,390 A | 3/1996 | Tanaka et al. |
| 5,513,202 A | 4/1996 | Kobayashi et al. |
| 5,530,715 A | 6/1996 | Shieh et al. |
| 5,555,255 A | 9/1996 | Kock et al. |
| 5,557,626 A | 9/1996 | Grodinski et al. |
| 5,561,683 A | 10/1996 | Kwon |
| 5,567,980 A | 10/1996 | Holonyak, Jr. et al. |
| 5,568,498 A | 10/1996 | Nilsson |
| 5,568,499 A | 10/1996 | Lear |
| 5,574,738 A | 11/1996 | Morgan |
| 5,581,571 A | 12/1996 | Holonyak, Jr. et al. |
| 5,586,131 A | 12/1996 | Ono et al. |
| 5,590,145 A | 12/1996 | Nitta |
| 5,598,300 A | 1/1997 | Magnusson et al. |
| 5,606,572 A | 2/1997 | Swirhun et al. |
| 5,625,729 A | 4/1997 | Brown |
| 5,642,376 A | 6/1997 | Olbright et al. |
| 5,645,462 A | 7/1997 | Banno et al. |
| 5,646,978 A | 7/1997 | Klem et al. |
| 5,648,978 A | 7/1997 | Sakata |
| 5,666,376 A * | 9/1997 | Cheng ................ 372/50.21 |
| 5,679,963 A | 10/1997 | Klem et al. |
| 5,692,083 A | 11/1997 | Bennett |
| 5,696,023 A | 12/1997 | Holonyak, Jr. et al. |
| 5,699,373 A | 12/1997 | Uchida et al. |
| 5,712,188 A | 1/1998 | Chu et al. |
| 5,726,805 A | 3/1998 | Kaushik et al. |
| 5,727,013 A | 3/1998 | Botez et al. |
| 5,727,014 A | 3/1998 | Wang et al. |
| 5,774,487 A | 6/1998 | Morgan |
| 5,778,018 A | 7/1998 | Yoshikawa et al. |
| 5,781,575 A | 7/1998 | Nilsson |
| 5,784,399 A | 7/1998 | Sun |
| 5,790,733 A | 8/1998 | Smith et al. |
| 5,805,624 A | 9/1998 | Yang et al. |
| 5,818,066 A | 10/1998 | Duboz |
| 5,818,861 A | 10/1998 | Tan et al. |
| 5,828,684 A | 10/1998 | Van de Walle |
| 5,838,705 A | 11/1998 | Shieh et al. |
| 5,838,715 A | 11/1998 | Corzine et al. |
| 5,892,784 A | 4/1999 | Tan et al. |
| 5,892,787 A | 4/1999 | Tan et al. |
| 5,896,408 A | 4/1999 | Corzine et al. |
| 5,901,166 A | 5/1999 | Nitta et al. |
| 5,903,588 A | 5/1999 | Guenter et al. |
| 5,903,589 A | 5/1999 | Jewell |
| 5,903,590 A | 5/1999 | Hadley et al. |
| 5,908,408 A | 6/1999 | McGary et al. |
| 5,936,266 A | 8/1999 | Holonyak, Jr. et al. |
| 5,940,422 A | 8/1999 | Johnson |
| 5,953,362 A | 9/1999 | Pamulapati et al. |
| 5,978,401 A | 11/1999 | Morgan |
| 5,978,408 A | 11/1999 | Thornton |
| 5,995,531 A | 11/1999 | Gaw et al. |
| 6,002,705 A | 12/1999 | Thornton |
| 6,008,675 A | 12/1999 | Handa |
| 6,014,395 A | 1/2000 | Jewell |
| 6,043,104 A | 3/2000 | Uchida et al. |
| 6,046,065 A | 4/2000 | Goldstein et al. |
| 6,052,398 A | 4/2000 | Brillouet et al. |
| 6,055,262 A | 4/2000 | Cox et al. |
| 6,060,743 A | 5/2000 | Sugiyama et al. |
| 6,078,601 A | 6/2000 | Smith |
| 6,086,263 A | 7/2000 | Selli et al. |
| 6,133,590 A | 10/2000 | Ashley et al. |
| 6,144,682 A | 11/2000 | Sun |
| 6,154,480 A | 11/2000 | Magnusson et al. |
| 6,185,241 B1 | 2/2001 | Sun |
| 6,191,890 B1 | 2/2001 | Baets et al. |
| 6,208,681 B1 | 3/2001 | Thornton |
| 6,212,312 B1 | 4/2001 | Grann et al. |
| 6,238,944 B1 | 5/2001 | Floyd |
| 6,269,109 B1 | 7/2001 | Jewell |
| 6,297,068 B1 | 10/2001 | Thornton |
| 6,302,596 B1 | 10/2001 | Cohen et al. |
| 6,339,496 B1 | 1/2002 | Koley et al. |
| 6,369,403 B1 | 4/2002 | Holonyak, Jr. |
| 6,372,533 B1 | 4/2002 | Jayaraman et al. |
| 6,392,257 B1 | 5/2002 | Ramdani et al. |
| 6,410,941 B1 | 6/2002 | Taylor et al. |
| 6,411,638 B1 | 6/2002 | Johnson et al. |
| 6,427,066 B1 | 7/2002 | Grube |
| 6,455,879 B1 | 9/2002 | Ashley et al. |
| 6,459,709 B1 | 10/2002 | Lo et al. |
| 6,459,713 B1 | 10/2002 | Jewell |
| 6,462,360 B1 | 10/2002 | Higgins, Jr. et al. |
| 6,472,694 B1 | 10/2002 | Wilson et al. |
| 6,477,285 B1 | 11/2002 | Shanley |
| 6,487,230 B1 | 11/2002 | Boucart et al. |
| 6,487,231 B1 | 11/2002 | Boucart et al. |
| 6,490,311 B1 | 12/2002 | Boucart et al. |
| 6,493,371 B1 | 12/2002 | Boucart et al. |
| 6,493,372 B1 | 12/2002 | Boucart et al. |
| 6,493,373 B1 | 12/2002 | Boucart et al. |
| 6,496,621 B1 | 12/2002 | Kathman et al. |
| 6,498,358 B1 | 12/2002 | Lach et al. |
| 6,501,973 B1 | 12/2002 | Foley et al. |
| 6,515,308 B1 | 2/2003 | Kneissl et al. |
| 6,535,541 B1 | 3/2003 | Boucart et al. |
| 6,536,959 B1 | 3/2003 | Kuhn et al. |

| | | | |
|---|---|---|---|
| 6,542,531 B1 | 4/2003 | Sirbu et al. | |
| 6,567,435 B1 | 5/2003 | Scott et al. | |
| 6,570,905 B1 * | 5/2003 | Ebeling | 372/96 |
| 6,810,065 B1 * | 10/2004 | Naone | 372/96 |
| 2001/0004414 A1 | 6/2001 | Kuhn et al. | |
| 2002/0150135 A1 * | 10/2002 | Naone et al. | 372/45 |
| 2002/0154675 A1 | 10/2002 | Deng et al. | |
| 2003/0067009 A1 * | 4/2003 | Chua et al. | 257/84 |
| 2003/0072526 A1 | 4/2003 | Kathman et al. | |
| 2004/0062283 A1 * | 4/2004 | Takeuchi et al. | 372/45 |

FOREIGN PATENT DOCUMENTS

| | | |
|---|---|---|
| EP | 0288184 A2 | 10/1988 |
| EP | 0776076 A1 | 5/1997 |
| JP | 60123084 | 1/1985 |
| JP | 02054981 | 2/1990 |
| JP | 5299779 | 11/1993 |
| WO | WO 98/57402 | 12/1998 |

OTHER PUBLICATIONS

Bowers et al., "Fused Vertical Cavity Lasers With Oxide Aperture", Final report for MICRO project 96-042, Industrial Sponsor: Hewlett Packard, 4 pages, 1996-97.

Catchmark et al., "High Temperature CW Operation of Vertical Cavity Top Surface-Emitting Lasers", CLEO 1993, p. 138.

Chemla et al., "Nonlinear Optical Properties of Semiconductor Quantum Wells", *Optical Nonlinearities and Instabilities in Semiconductors*, Academic Press, Inc., Copyright 1988, pp. 83-120.

Choe, et al., "Lateral oxidation of AlAs layers at elevated water vapour pressure using a closed-chamber system," Letter to the Editor, Semiconductor Science Technology, 15, pp. L35-L38, Aug. 2000.

Choa et al., "High-Speed Modulation of Vertical-Cavity Surface-Emitting Lasers", *IEEE Photonics Technology Letter*, vol. 3, No. 8, Aug. 1991, pp. 697-699.

Choquette et al., "High Single Mode Operation from Hybrid Ion Implanted/Selectivity Oxidized VCSELs", 200 IEEE 17th International Semiconductor Laser Conference, Monterrey, CA pp. 59-60.

Choquette et al., "Lithographically-Defined Gain Apertures Within Selectively Oxidized VCSELs", paper CtuL6, Conference on Lasers and Electro-Optics, San Francisco, California (2000).

Choquette, et al., "VCSELs in information systems: 10Gbps$^{-1}$ oxide VCSELs for data communication", Optics In Information Systems, vol. 12, No. 1, p. 5, SPIE International Technical Group Newsletter, Apr. 2001.

Choquette, Kent D., et al., Design of Oxide Aperture Profile within Selectively Oxidized VCSELs, IEEE, Conference Proceedings, LEOS '98, 11th Annual Meeting, Orlando, Florida, Dec. 1-4, 1998, pp. 179-180.

Chua, et al., "Low-Threshold 1.57- μm VC-SEL's Using Strain-Compensated Quantum Wells and Oxide/Metal Backmirror," IEEE Photonics Technology Letters, vol. 7, No. 5, pp. 444-446, May 1995.

Chua, et al., "Planar Laterally Oxidized Vertical-Cavity Lasers for Low-Threshold High-Density Top-Surface-Emitting Arrays," IEEE Photonics Technology Letters, vol. 9, No. 8, pp. 1060-1062, Aug. 1997.

Cox, J. A., et al., "Guided Mode Grating Resonant Filters for VCSEL Applications", *Proceedings of the SPIE*, The International Society for Optical Engineering, Diffractive and Holographic Device Technologies and Applications V, San Jose, California, Jan. 28-29, 1998, vol. 3291, pp. 70-71.

Farrier, Robert G., "Parametric control for wafer fabrication: New CIM techniques for data analysis," Solid State Technology, pp. 99-105, Sep. 1997.

Fushimi, et al., "Degradation Mechanism in Carbon-doped GaAs Minority-carrier Injection Devices," 34th Annual IRPS Proceedings, Dallas, Tx., Apr. 29-May 2, 1996, 8 pages.

G. G. Ortiz, et al., "Monolithic Integration of In0.2 GA0.8As Vertical Cavity Surface-Emitting Lasers with Resonance-Enhanced Quantum Well Photodetectors", *Electronics Letters*, vol. 32, No. 13, Jun. 20, 1996, pp. 1205-1207.

G. Shtengel et al., "High-Speed Vertical-Cavity Surface-Emitting Lasers", *Photon. Tech. Lett.*, vol. 5, No. 12, pp. 1359-1361 (Dec. 1993).

Geib, et al., "Comparison of Fabrication Approaches for Selectively Oxidized VCSEL Arrays," Proceedings of SPIE, vol. 3946, pp. 36-40, 2000.

Graf, Rudolph, *Modern Dictionary of Electronics*, 6th ed., Indiana: Howard W. Sams & Company, 1984, p. 694.

Guenter et al., "Reliability of Proton-Implanted VCSELs for Data Communications", Invited paper, *SPIE*, vol. 2683, OE LASE 96; Photonics West: Fabrication, Testing and Reliability of Semiconductor Lasers, (SPIE, Bellingham, WA 1996).

Guenter, et al., "Commercialization of Honeywell's VCSEL technology: further developments," Proceedings of the SPIE, vol. 4286, GSPIE 2000, 14 pages.

Hadley et al., "High-Power Single Mode Operation from Hybrid Ion Implanted/Selectively Oxidized VCSELs", 13th Annual Meeting IEEE Lasers and Electro-Optics Society 2000 Annual Meeting (LEOS 2000), Rio Grande, Puerto Rico, pp. 804-805.

Hawthorne, et al., "Reliability Study of 850 nm VCSELs for Data Communications," IEEE, pp. 1-11, May 1996.

Herrick, et al., "Highly reliable oxide VCSELs manufactured at HP/Agilent Technologies," Invited Paper, Proceedings of SPIE vol. 3946, pp. 14-19, 2000.

Hibbs-Brenner et al., "Performance, Uniformity and Yield of 850nm VCSELs Deposited by MOVPE", *IEEE Phot. Tech. Lett.*, vol. 8, No. 1, pp. 7-9, Jan. 1996.

Hideaki Saito, et al., "Controlling polarization of quantum-dot surface-emitting lasers by using structurally anisotropic self-assembled quantum dots," American Institute of Physics, Appl. Phys. Lett. 71 (5), pp. 590-592, Aug. 4, 1997.

Hornak et al., "Low-Termperature (10K-300K) Characterization of MOVPE-Grown Vertical-Cavity Surface-Emitting Lasers", *Photon. Tech. Lett.*, vol. 7, No. 10, pp. 1110-1112, Oct. 1995.

Huffaker et al., "Lasing Characteristics of Low Threshold Microcavity Layers Using Half-Wave Spacer Layers and Lateral Index Confinement", *Appl. Phys. Lett.*, vol. 66, No. 14, pp. 1723-1725, Apr. 3, 1995.

Jewell et al., "Surface Emitting Microlasers for Photonic Switching & Intership Connections", *Optical Engineering*, vol. 29, No. 3, pp. 210-214, Mar. 1990.

Jiang et al., "High-Frequency Polarization Self-Modulation in Vertical-Cavity Surface-Emitting Lasers", *Appl. Phys. Letters*, vol. 63, No. 26, Dec. 27, 1993, pp. 2545-2547.

K.L. Lear et al., "Selectively Oxidized Vertical Cavity Surface-Emitting Lasers with 50% Power Conversion Efficiency", *Elec. Lett.*, vol. 31, No. 3 pp. 208-209, Feb. 2, 1995.

Kash, et al., "Recombination in GaAs at the AlAs oxide-GaAs interface," Applied Physics Letters, vol. 67, No. 14, pp. 2022-2024, Oct. 2, 1995.

Kishino et al., "Resonant Cavity-Enhanced (RCE) Photodetectors", *IEEE Journal of Quantum Electronics*, vol. 27, No. 8, pp. 2025-2034.

Koley B., et al., "Dependence of lateral oxidation rate on thickness of AlAs layer of interest as a current aperture in vertical-cavity surface-emitting laser structures", Journal of Applied Physics, vol. 84, No. 1, pp. 600-605, Jul. 1, 1998.

Kuchibhotla et al., "Low-Voltage High Gain Resonant_Cavity Avalanche Photodiode", *IEEE Photonics Technology Letters*, vol. 3, No. 4, pp. 354-356.

Lai et al., "Design of a Tunable GaAs/AlGaAs Multiple-Quantum-Well Resonant Cavity Photodetector", *IEEE Journal of Quantum Electronics*, vol. 30, No. 1, pp. 108-114.

Lee et al., "Top-Surface Emitting GaAs Four-Quantum-Well Lasers Emitting at 0-85 um", *Electronics Letters*, vol. 24, No. 11, May 24, 1990, pp. 710-711.

Lehman et al., "High Frequency Modulation Characteristics of Hybrid Dielectric/AlGaAs Mirror Singlemode VCSELs", *Electronic Letters*, vol. 31, No. 15, Jul. 20, 1995, pp. 1251-1252.

Maeda, et al., "Enhanced Glide of Dislocations in GaAs Single Crystals by Electron Beam Irradiation," Japanese Journal of Applied Physics, vol. 20, No. 3, pp. L165-L168, Mar. 1981.

Magnusson, "Integration of Guided-Mode Resonance Filters and VCSELs", Electo-Optics Research Center, Department of Electrical Engineering, University of Texas at Arlington, May 6, 1997.

Martinsson et al., "Transverse Mode Selection in Large-Area Oxide-Confined Vertical-Cavity Surface-Emitting Lasers Using a Shallow Surface Relief", *IEEE Photon. Technol. Lett.*, 11(12), 1536-1538 (1999).

Miller et al., "Optical Bistability Due to Increasing Absorption", *Optics Letters*, vol. 9, No. 5, May 1984, pp. 162-164.

Min Soo Park and Byung Tae Ahn, "Polarization control of vertical-cavity surface-emitting lasers by electro-optic birefringence," Applied Physics Letter, vol. 76, No. 7, pp. 813-815, Feb. 14, 2000.

Morgan et al., "200 C, 96-nm Wavelength Range, Continuous-Wave Lasing from Unbonded GaAs MOVPE-Grown Vertical Cavity Surface-Emitting Lasers", *IEEE Photonics Technology Letters*, vol. 7, No. 5, May 1995, pp. 441-443.

Morgan et al., "High-Power Coherently Coupled 8×8 Vertical Cavity Surface Emitting Laser Array", *Appl. Phys Letters*, vol. 61, No. 10, Sep. 7, 1992, pp. 1160-1162.

Morgan et al., "Hybrid Dielectric/AlGaAs Mirror Spatially Filtered Vertical Cavity Top-Surface Emitting Laser", *Appl. Phys. Letters*, vol. 66, No. 10, Mar. 6, 1995, pp. 1157-1159.

Morgan et al., "Novel Hibrid-DBR Single-Mode Controlled GaAs Top-Emitting VCSEL with Record Low Voltage", 2 pages, dated prior to Dec. 29, 2000.

Morgan et al., "One Watt Vertical Cavity Surface Emitting Laser", *Electron. Lett.*, vol. 29, No. 2, pp. 206-207, Jan. 21, 1993.

Morgan et al., "Producible GaAs-based MOVPE-Grown Vertical-Cavity Top-Surface Emitting Lasers with Record Performance", *Elec. Lett.*, vol. 31, No. 6, pp. 462-464, Mar. 16, 1995.

Morgan et al., "Progress and Properties of High-Power Coherent Vertical Cavity Surface Emitting Laser Arrays", *SPIE*, vo. 1850, Jan. 1993, pp. 100-108.

Morgan et al., "Progress in Planarized Vertical Cavity Surface Emitting Laser Devices and Arrays", *SPIE*, vol. 1562, Jul. 1991, pp. 149-159.

Morgan et al., "Spatial-Filtered Vertical-Cavity Top Surface-Emitting Lasers", CLEO, 1993, pp. 138-139.

Morgan et al., "Submilliamp, Low-Resistance, Continuous-Wave, Single-Mode GaAs Planar Vertical-Cavity Surface Emitting Lasers", Honeywell Technology Center, Jun. 6, 1995.

Morgan et al., "Transverse Mode Control of Vertical-Cavity Top-Surface Emitting Lasers", *IEEE Photonics Technology Letters*, vol. 4, No. 4, Apr. 1993, pp. 374-377.

Morgan et al., "Vertical-cavity surface-emitting laser arrays", Invited Paper, *SPIE*, vol. 2398, Feb. 6, 1995, pp. 65-93.

Morgan et al., Vertical-cavity surface emitting lasers come of age, Invited paper, *SPIE*, vol. 2683, 0-8194-2057, Mar. 1996, pp. 18-29.

Morgan, "High-Performance, Producible Verticle Cavity Lasers for Optical Interconnects", *High Speed Electronics and Systems*, vol. 5, No. 4, Dec. 1994, pp. 65-95.

Naone R.L., et al., "Tapered-apertures for high-efficiency miniature VCSELs", LEOS newsletter, vol. 13, No. 4, pp. 1-5, Aug. 1999.

Nugent et al., "Self-Pulsations in Vertical-Cavity Surface-Emitting Lasers", *Electronic Letters*, vol. 31, No. 1, Jan. 5, 1995, pp. 43-44.

Oh, T. H. et al., "Single-Mode Operation in Antiguided Vertical-Cavity Surface-Emitting Laser Using a Low-Temperature Grown AlGaAs Dielectric Aperture", *IEEE Photon. Technol. Lett*, 10(8), 1064-1066 (1998).

Osinski, et al., "Temperature and Thickness Dependence of Steam Oxidation of AlAs in Cylindrical Mesa Structure," IEEE Photonics Technology Letters, vol. 13, No. 7, pp. 687-689, Jul. 2001.

Peck, D. Stewart, Comprehensive Model for Humidity Testing Correlation, IEEE/IRPS, pp. 44-50, 1986.

Ries, et al., "Visible-spectrum ($\lambda$=650nm) photopumped (pulsed, 300 K) laser operation of a vertical-cavity AlAs-AlGaAs/InAlP-InGaP quantum well heterostructure utilizing native oxide mirrors," Applied Physics Letters, vol. 67, No. 8, pp. 1107-1109, Aug. 21, 1995.

S.S. Wang and R. Magnusson, "Multilayer Waveguide-Grating Filters", *Appl. Opt.*, vol. 34, No. 14, pp. 2414-2420, 1995.

S.S. Wang and R. Magnusson, "Theory and Applications of Guided-Mode Resonance Filters", *Appl. Opt.*, vol. 32, No. 14, pp. 2606-2613, 1993.

Sah, et al., "Carrier Generation and Recombination in P-N Junctions and P-N Junction Characteristics," Proceedings of the IRE, pp. 1228-1243, Sep., 1957.

Schubert, "Resonant Cavity Light-Emitting Diode", *Appl. Phys. Lett.*, vol. 60, No. 8, pp. 921-923, Feb. 24, 1992.

Shi, et al., "Photoluminescence study of hydrogenated aluminum oxide-semiconductor interface," Applied Physics Letters, vol. 70, No. 10, pp. 1293-1295, Mar. 10, 1997.

Smith, R.E. et al., Polarization-Sensitive Subwavelength Antireflection Surfaces on a Semiconductor for 975 NM, *Optics Letters*, vol. 21, No. 15, Aug. 1, 1996, pp. 1201-1203.

Spicer, et al., "The Unified Model For Schottky Barrier Formation and MOS Interface States in 3-5 Compounds," Applications of Surface Science, vol. 9, pp. 83-01, 1981.

Suning Tang et al., "Design Limitations of Highly Parallel Free-Space Optical Interconnects Based on Arrays of Vertical Cavity Surface-Emitting Laser Diodes, Microlenses and Photodetectors", Journal of Lightwave Technology, vol. 12, No. 11, Nov. 1, 1994, pp. 1971-1975.

T. Mukaihara, "Polarization Control of Vertical-cavity Surface-Emitting Lasers by a Birefringent Metal/Semiconductor Polarizer Terminating a Distributed Bragg Reflector," Tokyo Institute of Technology, Precision and Intelligence Laboratory, pp. 183-184.

Tao, Andrea, "Wet-Oxidation of Digitally Alloyed AlGaAs," National Nanofabrication Users Network, Research Experience for Undergraduates 2000, 2 pages.

Tatum, et al., Commerialization of Honeywell's VCSEL Technology, Published in Proceedings fo the SPIE, vol. 3946, SPI, 2000, 12 pages.

Tshikazu Mukaihara, et al., "A Novel Birefringent Distributed Bragg Reflector Using a Metal/Dielectric Polarizer for Polarization Control of Surface-Emitting Lasers," Japan J. Appl. Phys. vol. 33 (1994) pp. L227-L229, Part 2, No. 2B, Feb. 15, 1994.

Tu, Li-Wei et al., "Transparent conductive metal-oxide contacts in vertical-injection top-emitting quantum well lasers", Appl. Phys. Lett. 58 (8) Feb. 25, 1991, pp. 790-792.

Wieder, H.H., "Fermi level and surface barrier of $Ga_xIn_{1-x}As$ alloys," Applied Physics Letters, vol. 38, No. 3, pp. 170-171, Feb. 1, 1981.

Wipiejewski, et al., "VCSELs for datacom applications," Invited Paper, Part of the SPIE Conference on Vertical-Cavity Surface-Emitting Lasers III, San Jose, California, SPIE vol. 3627, pp. 14-22, Jan. 1999.

Y. M. Yang et al., "Ultralow Threshold Current Vertical Cavity Surface Emitting Lasers Obtained with Selective Oxidation", *Elect. Lett.*, vol. 31, No. 11, pp. 886-888, May 25, 1995.

Winston, David W., "Optoelectronic Device Simulation of Bragg Reflectors and Their Influence on Surface-Emitting Laser Characteristics," *IEEE Journal of Quantum Electronic*, vol. 34, No. 4, Apr. 1998, pp. 707-715.

Yablonovitch et al., "Photonic Bandgap Structures", *J. Opt. Soc. Am. B.*, vol. 10, No. 2, pp. 283-295, Feb. 1993.

Young et al., "Enhanced Performance of Offset-Gain High Barrier Vertical-Cavity Surface-Emitting Lasers", *IEEE J. Quantum Electron.*, vol. 29, No. 6, pp. 2013-2022, Jun. 1993.

U.S. Appl. No. 09/751,422, filed Dec. 29, 2000, entitled "Resonant Reflector for Use with Optoelectronic Devices".

U.S. Appl. No. 09/751,423, filed Dec. 29, 2000, entitled "Spatially Modulated Reflector for an Optoelectronic Device".

* cited by examiner

ELECTRON AFFINITY ENGINEERED VCSELS

The present patent application claims priority as a continuation-in-part of U.S. Nonprovisional patent application Ser. No. 09/724,820, filed Nov. 28, 2000, now U.S. Pat. No. 6,905,900 by Ralph Johnson et al., and entitled "Versatile Method and System for Single Mode VCSELS", which is hereby incorporated by reference in its entirety in the present application. The present patent application claims priority as a continuation-in-part of U.S. Nonprovisional patent application Ser. No. 10/283,381, filed Oct. 28, 2002, now U.S. Pat. No. 6,990,135 by Ralph Johnson et al., and entitled "Distributed Bragg Reflector for Optoelectronic Device", which is hereby incorporated by reference in its entirety in the present application.

BACKGROUND

The present invention pertains to lasers, and particularly to vertical cavity surface emitting lasers (VCSELs). More particularly, it pertains to electron affinity engineering of VCSELs.

SUMMARY

The present invention shows the use of electron affinity engineering to optimize VCSEL characteristics. This invention relates to the use of the AlGaAs electron affinity as a function of Al/Ga ratio to optimize the performance of VCSELs by reducing the series resistance of the N-type Bragg mirror and N-type spacer layer, reducing the free carrier absorption in the N-type spacer layer, facilitating the transfer of electrons between the N-type spacer layer and quantum wells, and optimizing hole confinement at high bias current and high temperature. All of these changes to the VCSEL material structure represent performance enhancements not known to be previously used in VCSELs.

DESCRIPTION

Figure 1:
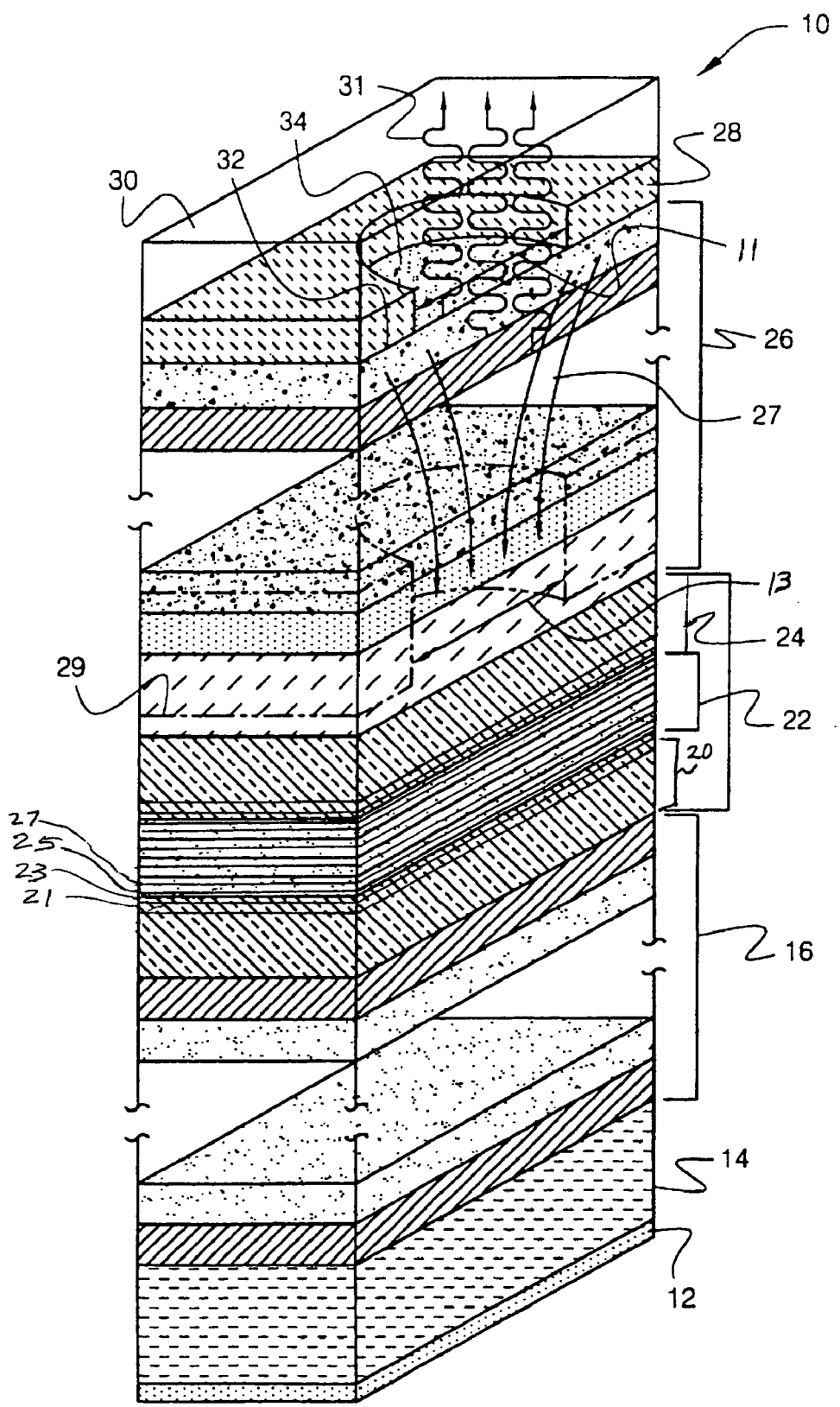
FIG. 1 is an illustration of a vertical cavity surface emitting laser.

FIG. 1 is an illustration of a planar, current-guided, vertical cavity surface emitting laser (VCSEL) 10 having periodic layer pairs for top and bottom Bragg mirrors. Formed on the bottom of a substrate 14 may be a bottom contact 12. Substrate 14 may be doped with impurities of a first type. A first-type doped mirror stack 16 may be formed on substrate 14. Formed on stack 16 may be a first-type doped spacer layer 20. The first-type doped bottom spacer layer 20 and a second-type doped top spacer layer 24 may sandwich an active region 22. A second-type doped mirror stack 26 may be formed on a top spacer layer 24. A metal layer 28 may be formed as a contact on a portion of stack 26. The emission region may have a passivation layer 30.

An isolation region 29 may restrict the area of the current flow 27 through the active region. Region 29 may be formed by an ion implantation and/or oxidation. A diameter 13 may be set to provide the desired active area, and thus the gain aperture of the VCSEL 10. Further, a diameter 11 may be set by the resistance of the second-type doped mirror stack 26, particularly through the non-conductive region 29. Thus, non-conductive region 29 may perform the gain guiding function. Diameter 13 may be limited by fabrication limitations, such as lateral straggle during the implantation or oxidation step.

There may be a quantum-well active region 22 disposed between spacer layers 20 and 24. Within spacer layer 20 or 24, proximate to active region 22, there may be a hole confinement barrier 21. There may be a step change 53 in Al composition at an edge of hole confinement barrier 21. There also may be a reduction in Al grade interface layer 23 between step change 53 and layer 25 of active region 22. Mirror stacks 16 and 26 may be adjacent to the bottom of spacer layer 20 and the top of spacer layer 24, respectively. The quantum-well active region 22 may have alternating layers AlGaAs barrier layers 25 and GaAs quantum-wells 27. Stacks 16 and 26 may be distributed Bragg reflector (DBR) stacks, and include periodic layers 41 and 42 (FIG. 2) of GaAs and AlAs, respectively. Layers 41 and 42 of one of the mirror stacks, such as an N-type one, may have a combination of steps and ramps relating to the composition changes between the adjacent layers of the respective mirror stack. An N-type mirror may be the top mirror 26 or the bottom mirror 16, or possibly both, depending on a particular VCSEL design. Various portions of the present discussion may refer to several configurations of the VCSEL.

Metal contact layers 12 and 28 may be ohmic contacts that allow appropriate electrical biasing of laser diode 10. When VCSEL 10 is forward biased with a voltage on contact 28 different than the one on contact 12, active region 22 may emit light 31 which passes through stack 26.

Figure 2:
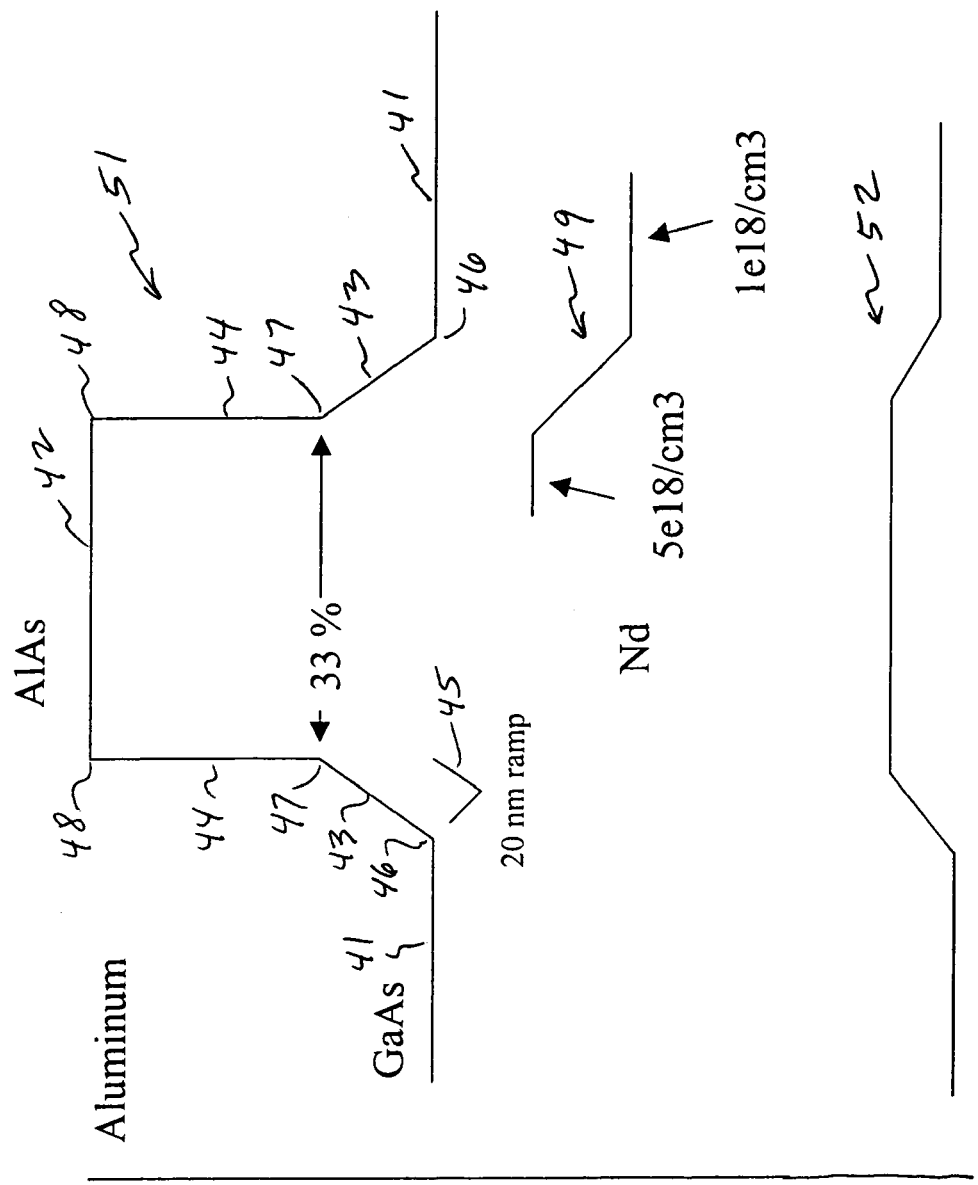
FIG. 2 reveals transition ramps of composition change from one layer to another of an N distributed Bragg period of a VCSEL mirror.

FIG. 2 shows a transition ramp 43 and a step change 44 of an aluminum composition from one layer 41 to another layer 42 of a periodic layer pair for an N distributed Bragg reflector of a VCSEL mirror 16. This transition may continue in reverse from layer 42 to layer 41 of another pair and so forth. The following described transition is one illustrative example of a combination of steps and ramps relative to various changes of compositions from one layer to another in a stack. For instance, layer 41 may be composed of GaAs. At the end of layer 41, there may be a 20 nm distance 45 away from layer 41 towards layer 42, where a ramp 43 starts at point 46 with an addition of Al up to 33 percent of the composition relative to Ga reached at point 47. The composition at point 47 may be $Al_{0.33}Ga_{0.67}As$. Then, there may be a step increase 44 of Al to a point 48 where the Al content is 100 percent relative to the Ga, i.e., AlAs, which may be layer 42 in this instance. The transition from layer 42 may be a reverse sequence, with a step from 100 percent at point 48 to 33 percent at point 47, i.e., $Al_{0.33}Ga_{0.67}As$. The remaining decrease of Al may be a linear graded region or ramp 43 from 33 percent at point 47 to zero percent composition of Al, i.e., GaAs, at point 46 at the start of the next layer 41.

Linear ramps 43 may be approximated by small steps in composition or digital alloys. The linear doping 49 and composition 51 profiles of FIG. 2 may not necessarily give a totally flat conduction band, but provide a reasonably implemented approximation. The doping 49 may be 1e18/cm3 at layer 41 and point 46, and may ramp up to 5e18/cm3 at point 47 of profile 51. The electron affinity plot 52 appears to reflect more of a sign of electron affinity rather than its magnitude. One may note the lack of jump in electron affinity profile 52 despite the composition jump at step 44 in profile 51. The linear ramp 43 to 33 percent may actually be a combination of small steps. The step 44 from 33 to 100 percent instead of 38 to 100 percent may reflect another of these small steps. The small variations about 38 to 100 percent, or vice versa, may be acceptable since small steps are generally not a problem. Since 38 percent material may have the same electron affinity as 100 percent, a step at 38 percent may be redundant.

Figure 3:
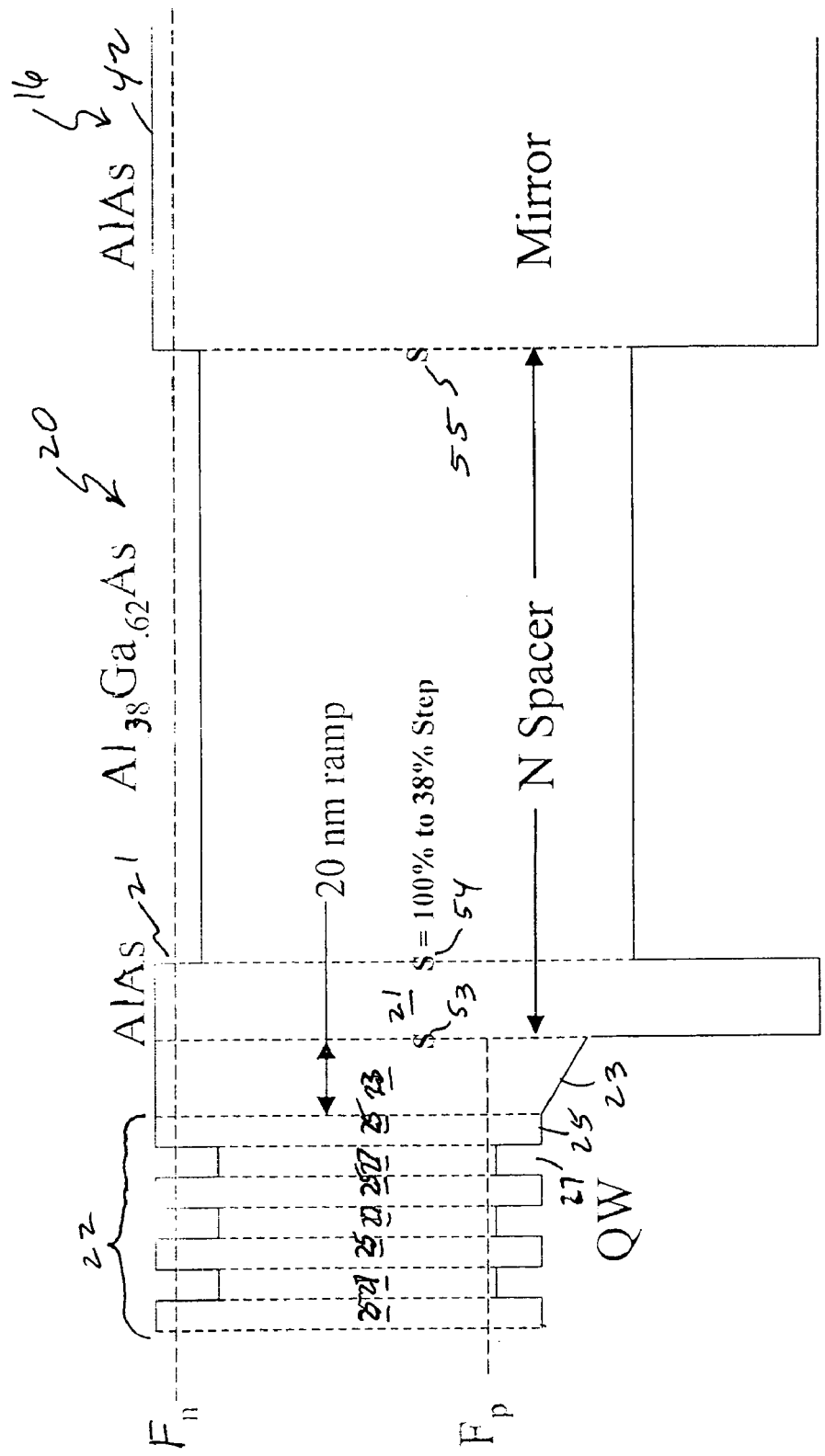
FIG. 3 a diagram showing an N spacer incorporating a hole confinement barrier.

FIG. 3 is a diagram showing a portion of layer 42 of mirror 16 towards active region 22. The may be a step change 55 from AlAs of layer 42 to $Al_{0.38}Ga_{0.62}As$ of N-spacer 20. There may be a 38 to 100 percent step change 54 in the direction of barrier 21. At the edge of barrier 21 near the active region 22, there may be a 100 to 38 percent step change 53. From that edge of barrier 21 to quantum well barrier 25, there may be a 38 to 25 percent graded change or ramp 23 of Al composition. Active region 22 may incorporate GaAs wells 27 with $Al_{0.25}Ga_{0.75}As$ barriers 25.

The Al content in the layers 41 and 42 may not necessarily be 0 percent or 100 percent respectively. For instance, the percentages of Al could instead be 15 percent and 85 percent, respectively, with a corresponding step and ramp combination for the Al change between the layers. Or the layers 41 and 42 could have 0 and 100 percentages of Al, as noted above, but have different step and ramp break points, such as at 15 or 85 percent. Still further, both the Al or other material composition percentages and the step-ramp break transition points between layers in a stack, between the stack and a spacer, or between the spacer and a quantum well wall, may be different than the illustrative examples noted in the present description. They may be particularly selected for a desired design.

The band edge plot of FIG. 3 represents an 850 nm VCSEL biased near threshold. $F_n$ is the electron quasi-Fermi Level and $F_p$ is the hole quasi-Fermi level. The plot shows the GaAs quantum wells 27, $Al_{0.25}Ga_{0.75}As$ barrier layers 25, and the AlAs barrier layer 21 to provide hole confinement. The aluminum composition steps from 100 percent to about 38 percent do not produce a difference in electron affinity as shown in profile 52 of FIG. 2. The quantum wells 27 and barrier layers 25 are undoped. The conduction band offsets are the result of differences in donor concentration and density of states in the direct and indirect bandgap layers.

Figure 4:
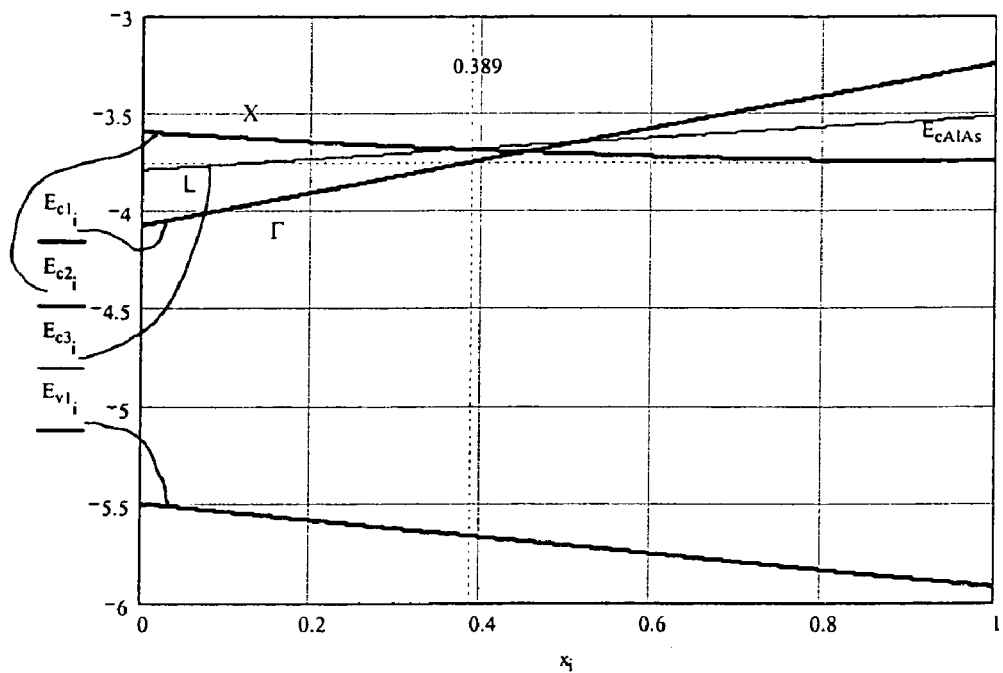
FIG. 4 is a plot is based on a 66/34 split between the Γ conduction band and the valence band for Al<0.45.
Figure 5:
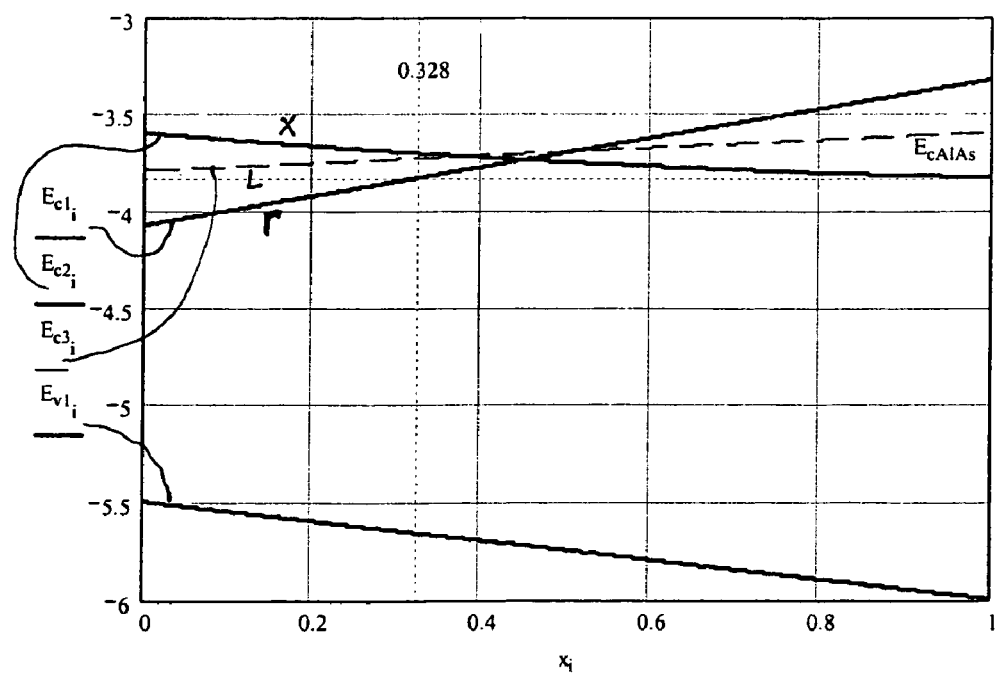
FIG. 5 is a plot based on a 60/40 split between the Γ conduction band and the valence band for Al<0.45.

Based on band gap and electron affinity models for AlGaAs, a band diagram for the full range of compositions is shown in FIG. 4. This plot is based on a 66/34 split between the Γ conduction band and the valence band for Al<0.45. A similar plot is shown in FIG. 5 based on a 60/40 split between the Γ conduction band and the valence band for Al<0.45. From FIG. 4, it may be seen that the X conduction band for AlAs has the same electron affinity as the Γ conduction band for $Al_{0.389}Ga_{0.611}As$. In this plot, the rise in the conduction band edge between AlAs and $Al_{0.45}Ga_{0.55}As$ is 50.35 meV. For the FIG. 5 band arrangement, this same condition may occur for $Al_{0.328}Ga_{0.672}As$. In FIG. 5, the rise in the conduction band edge is 91.49 meV. FIGS. 4 and 5 represent a range of data for the AlGaAs band structure. For N-type AlGaAs with Al fraction between 0.40 and 0.50, the resistivity is dominated by DX centers associated with the L band shown in FIGS. 4 and 5. For low series resistance in a VCSEL, this range of Al fraction should be avoided in N-type material. This observation may be used to good advantage in two places in a VCSEL, i.e., N-type mirror and N-type spacer.

One may note the application of electron affinity engineering relative to mirrors. The N-type Bragg mirror in VCSELs has typically been constructed with layers of high bandgap (low index) and low bandgap (high index) layers of AlGaAs. These alternating layers have been separated by linear graded regions of Al composition. This approach may use a step in Al composition followed by a graded region in the N-type Bragg mirror to give a lower and more linear series resistance. The approach may also be applied to the N-type spacer layer adjacent to the quantum wells. This spacer layer has typically been a high bandgap indirect layer separated from the top mirror layer by a linear grade. Using the same step in composition, the N-type spacer may be formed from a lower bandgap direct AlGaAs layer which can provide lower free carrier absorption. Electron affinity engineering as shown here may also be used to insert a minority carrier hole barrier adjacent to the quantum wells to improve hole confinement at high current density and high temperature.

Figure 6:
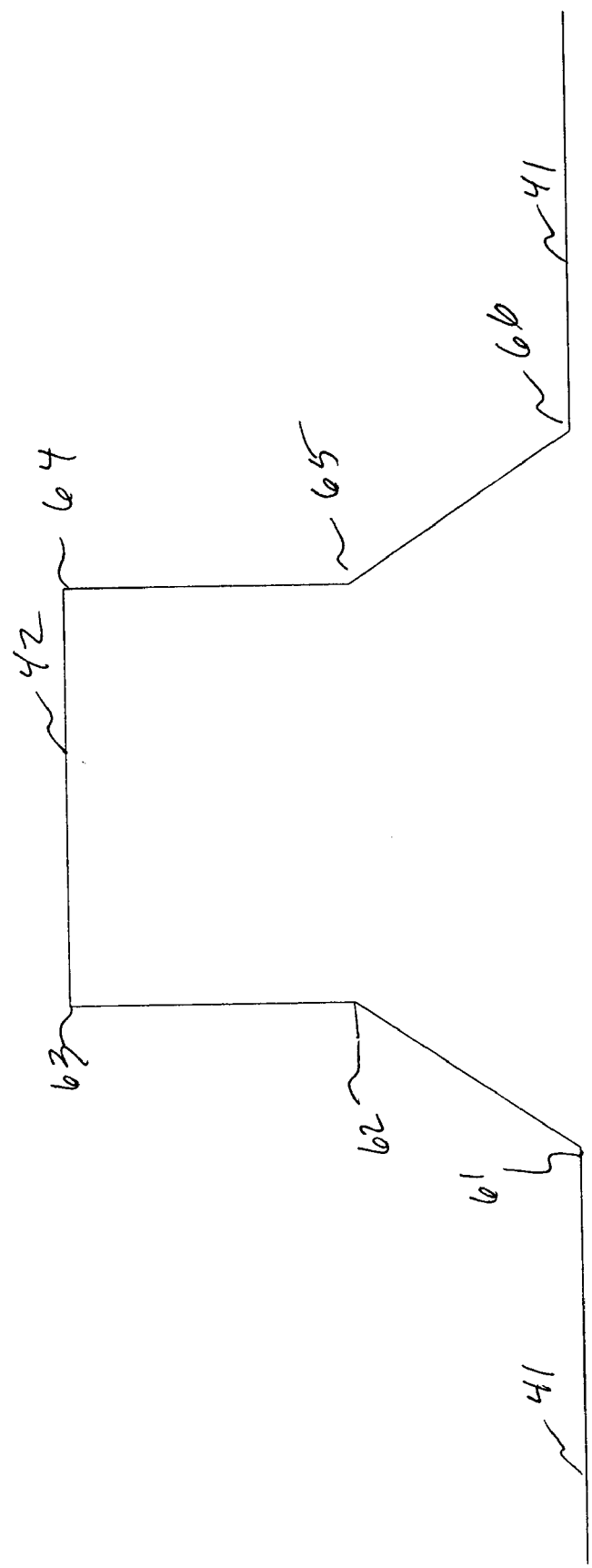
FIG. 6 is an illustrative example of a template diagram that may be used for various compositions and their transitions between stack layers.

FIG. 6 is a template that may be used for various compositions and their transitions between stack layers. The mirror stack may have a number of pairs of GaAs and AlAs layers 41 and 42, respectively. An interface situated between from a GaAs layer to an AlAs layer may include an interface having a ramp increase of Al from GaAs to $Al_xGa_{1-x}As$ between points 61 and 62, and a step increase of Al from $Al_xGa_{1-x}As$ to $Al_yGa_{1-y}As$ between points 62 and 63. The other interface may include a step decrease of Al from $Al_yGa_{1-y}A$ to $Al_xGa_{1-x}As$ between points 64 and 65, and a ramp decrease of Al from $Al_xGa_{1-x}As$ to GaAs between points 65 and 66. Of course, layer 41 may have some percentage of Al at point 61, such as $Al_{0.15}Ga_{0.85}As$, as an illustrative example. Similarly or alternatively, layer 42 may have some percentage of Ga, such as $Al_{0.85}Ga_{0.15}As$, as an illustrative example. In other words, the values of x and y may be anywhere from 0.0 to 1.0, as desired for a particular design. The step and ramp combination may be non-symmetrical, plural, and/or in various orders.

Figure 7:
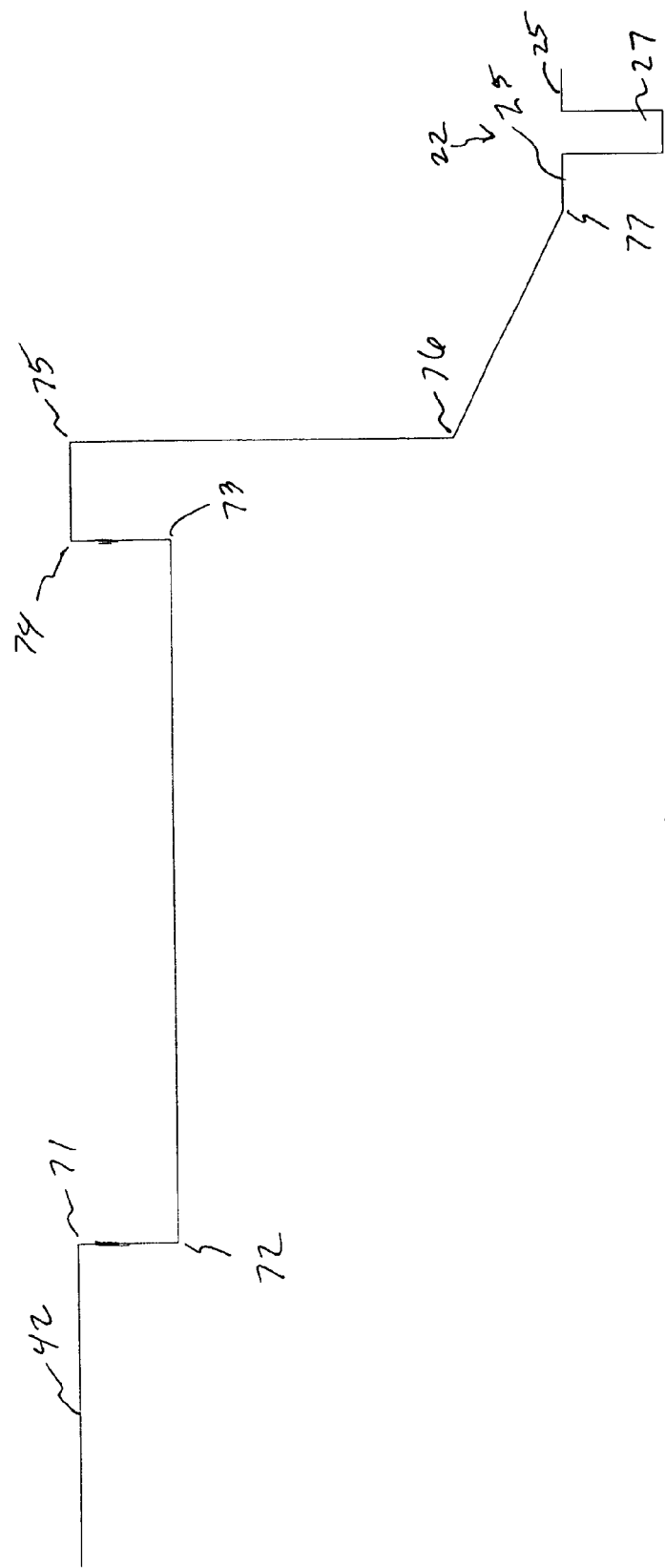
FIG. 7 is an illustrative example of a template diagram that may be used for transitions from a mirror stack to a spacer layer, including a barrier 21 if incorporated, and to an active region.

FIG. 7 is template that may be used for transitions from a mirror stack (stack 16 as an example) to a spacer layer 20, including a barrier 21 if incorporated, and to the active region 22. Layer 42, for example, may have a composition of $Al_yGa_{1-y}As$. A step from point 71 to point 72 may be from $Al_yGa_{1-y}As$ to $Al_zGa_{1-z}As$. The barrier may begin at point 73 with a step to point 74 with a step change of composition from $Al_zGa_{1-z}As$ to $Al_yGa_{1-y}As$. From point 75 to 76 may be a step change of composition from $Al_yGa_{1-y}As$ to $Al_wGa_{1-w}As$. Between point 76 and point 77 may be a ramp change from $Al_wGa_{1-w}As$ to $Al_vGa_{1-v}As$, which may the composition of wall 25 of quantum well 27. The values of y, z, w and v may be values selected from a range from 0.0 to 1.0 for a desired design anywhere between 0.0 and 1.0. The step and ramp combination may be non-symmetrical, plural, and/or in various orders.

Some devices relevant to the present approach may include, among others, 850 nm proton and oxide VCSELs and 1300 nm VCSELs. In the N-type Bragg mirror, past proton VCSEL designs have graded the aluminum composition in a linear fashion from 1.0 to 0.15 or 0.15 to 1.0 over a distance of 20 nm at each of the 64 interfaces. This practice may produce a peak in the conduction band energy at an aluminum composition of 0.45. This peak in the conduction band energy may cause a barrier to the flow of majority carrier electrons which cannot be completely overcome with the donor doping profile. The result is an increase in the vertical resistance of the N-type Bragg mirror.

The present approach relates to an improvement, i.e., a reduction, in the vertical resistance of the Bragg mirror by replacing the linear grade described above with a step in the aluminum composition from 1.0 to 0.389 (or 0.328) followed by a linear grade from 0.389 (or 0.328) to 0.15. At the other N-type mirror interface, there may be a linear grade in the aluminum composition from 0.15 to 0.389 (or 0.328) followed by a step from 0.389 (or 0.328) to 1.0. This new aluminum profile may result in the minimum barrier to electron flow and lower vertical series resistance in the N-type Bragg mirror. Available data on AlGaAs do not appear sufficiently accurate to predict the specific Al fraction between the values of 0.32 and 0.39 that gives the lowest N-type Bragg mirror resistance. This optimum value may be determined experimentally on a case by case basis.

In oxide VCSELs, several of the mirror periods just below the quantum wells may have a composition of $Al_{0.85}Ga_{0.15}As$. In this case, the Al fraction for minimum N-type Bragg mirror resistance may lie in the range 0.350 to 0.395.

This N-type Bragg mirror profile has been evaluated using MBE material growth for 1300 nm VCSELs. In this case, the N-type mirror Al fraction has a step from 1.0 to 0.389 (or 0.328) followed by a linear grade from 0.389 (or 0.328) to 0.0. The narrow bandgap portions of the Bragg mirror for 1300 nm VCSELs is GaAs. At the other N-type mirror interface there is a linear grade from 0.0 to 0.389 (or 0.328) followed by a step from 0.389 (or 0.328) to 1.0. Using this approach, it may be shown that there is a significant reduction in vertical series resistance in N-type Bragg mirror test samples.

The N-type spacer layer adjacent to the quantum wells may also benefit from the electron affinity engineering of the present approach. In the past, this spacer layer used an Al fraction of 0.65 with a linear graded region between the top N-type mirror layer (Al fraction of 1.0 or 0.85) and the spacer (Al fraction of 0.65). Three immediate benefits may result from using a step function of Al fraction between the top N-type mirror layer and the N-type spacer such that the electron affinity is the same on both sides of the step. They are: 1) The rise in the conduction band edge is avoided; 2) the DX center range of Al fraction is avoided; and 3) the spacer layer now has a direct bandgap. Eliminating the rise in the conduction band edge facilitates the flow of majority carrier electrons between the top mirror layer and spacer layer; this lowers the series resistance. Making the spacer layer from a direct bandgap material with Al fraction <0.45 gives a higher electron mobility which reduces the series resistance for a given donor impurity concentration. The optical free carrier absorption is highest in the center of the VCSEL structure around the quantum wells and spacer layers. With a higher carrier mobility in the N-type spacer, the donor concentration and free carrier absorption may be reduced while still maintaining the same or lower series resistance. This lowers the threshold current of the VCSEL and improves its performance.

One may note the application of electron affinity engineering relative to spacers. The N-type spacer layer in the VCSEL may extend from the quantum wells to the first high aluminum layer in the N-type Bragg mirror. In some VCSEL designs, this N-type spacer layer has been $Al_{0.65}Ga_{0.35}As$. In proton VCSEL designs, the top layer in the N-type Bragg mirror has been AlAs; oxide VCSEL designs have used $Al_{0.85}Ga_{0.15}As$ for the top layer to avoid rapid oxidation when the RIE trench etch penetrates into the N-type Bragg mirror. The N-type spacer is separated from the top Bragg mirror layer with a linear grade in aluminum composition. Near the quantum wells, the aluminum fraction has been graded from 0.65 to the 0.25 value used in the barrier layers around the quantum wells. The $Al_{0.65}Ga_{0.35}As$ alloy normally used in the N-type spacer layer may provide a large barrier to holes in the valence band which ensures good hole confinement at high bias levels and high temperature.

Potential drawbacks of this design result from the material with aluminum fraction of 0.65 having an indirect bandgap. This gives relatively low mobility and high vertical series resistance for a given doping level in the N-type spacer. This also requires that the majority carrier electrons must scatter from the indirect X conduction band minimum to the direct Γ conduction band minimum in order to be injected and populate the levels in the quantum wells. This added scattering time tends to increase the rise time of the VCSEL.

Using the lower aluminum composition of 0.389 (or 0.328) described above (relative to FIGS. 4 and 5) in the N-type spacer may improve the VCSEL in the following ways. First, the graded region between the Bragg mirror and spacer may be replaced with a step in composition to an alloy with the same electron affinity as the mirror layer. This will reduce the barrier to electron flow found in previous designs using the linear grade in aluminum composition and result in a reduction in series resistance. The N-type spacer layer may now be a direct bandgap semiconductor. The scattering of majority carriers from the indirect X conduction band to the direct Γ conduction band now occurs at the Bragg mirror rather than near the quantum wells. This should eliminate the risetime limitation associated with having that transition near the quantum wells.

Second, the fact that the N-type spacer now is a direct bandgap material gives it a much higher electron mobility. Therefore, a given series resistance can be obtained with a much lower donor doping concentration. This reduces the free carrier absorption close to the quantum wells where the E-field standing wave has the highest amplitude. Decreased free carrier absorption can improve the efficiency of the VCSEL.

Third, with the direct bandgap N-type spacer, the ramp from 0.389 (or 0.328) aluminum fraction to the 0.25 aluminum fraction in the barrier layer is all direct bandgap and should not impose a speed limitation on the VCSEL. Fourth, using a step function in the Al fraction from the top N-type Bragg mirror layer to the direct band gap N-type spacer with the same electron affinity avoids the DX center range of Al fraction between 0.40 and 0.50.

A potential drawback to the lower aluminum composition in the N-type barrier layer is a possible loss of hole confinement due to the lower bandgap that gives a lower valence band barrier to holes in the quantum well region. For the $Al_{0.65}Ga_{0.35}As$ N-type spacer layer and the $Al_{0.25}Ga_{0.75}As$ barrier layer, the hole barrier is 0.170 eV; with the $Al_{0.389}Ga_{0.611}As$ spacer the hole barrier is reduced to 0.059 eV. Even with the lower aluminum composition, the hole barrier may be sufficient to avoid loss of hole confinement at high injection levels and at high operating temperature. This potential drawback may be evaluated experimentally.

There has been an evaluation MOCVD material growth runs with the reduced aluminum composition in the N-type spacer layer. The resultant samples exhibited superior quantum well photoluminescence as compared to $Al0.65Ga_{0.35}As$ N-type spacer material samples. Device evaluation showed no undesirable effects for the tests performed. No increase in speed was observed in the digital rise and fall time tests.

One may note the application of electron affinity engineering relative to barrier layers. The barrier layers around the quantum wells typically have an Al fraction of 0.25. When an Al fraction of 0.65 is used in the spacer layer, there is a linear gradient of Al fraction between the N-type spacer and the bottom barrier layer. This linear gradient may go through both a rise in conduction band edge and the Al fraction range associated with the DX centers. Using a direct bandgap N-type spacer layer with electron affinity the same as the top N-type mirror layer, the transition between the spacer layer and the barrier is all in direct bandgap material. Thus, by using electron affinity engineering, the rise in conduction band edge and the DX center range are both avoided. The elimination of both these undesirable effects facilitates the transport of electrons from the N-type spacer into the quantum wells.

The barrier layer may be a hole barrier. An aspect of engineering the electron affinity in VCSELs is the incorporation of the barrier to improve hole confinement in the quantum well region. A hole barrier may be introduced in the N-type spacer layer adjacent to the quantum wells. A hole barrier of this sort is important for VCSEL operation at high temperature and/or high bias currents where minority carrier hole confinement may be lost. Loss of hole confinement is undesirable because it decreases the efficiency of the VCSEL. The hole barrier may be a thin layer of AlAs placed at the top edge of the N-type spacer layer adjacent to the linear graded layer between the spacer and the bottom barrier layer. The hole barrier layer may be doped N-type with a donor concentration that aligns the conduction band with that of the spacer layer. This should ensure minimum resistance to the flow of majority carrier electrons from the spacer to the barrier layer. However, with N-type doping in the hole barrier layer, the full bandgap of AlAs may be extended into the valence band. Holes will only be able to penetrate this barrier by tunneling. The hole barrier layer does not have to be very thick since the high effective mass of holes in the AlGaAs material system ($m^* \sim 0.75$) and the high barrier potential make the tunneling probability for holes very low. A hole barrier layer thickness of 8–10 nm should be sufficient to confine the minority carrier holes. Thus, the minority carrier holes injected into the quantum well region may be contained in that region by the presence of the hole barrier, and the loss of hole confinement is eliminated or dramatically reduced. The hole barrier is similar to that produced by the oxide tunneling barrier encountered in silicon bipolar transistors that use polysilicon emitters. In this case, the hole barrier is implemented by the agency of electron affinity engineering in the AlGaAs material system. The indirect hole barrier layer is less than 10% of the total thickness of the N-type spacer. Thus, more than 90% of the performance associated with the direct bandgap N-type spacer will be realized along with improved hole confinement.

The use of the step in Al fraction has been shown with 1300 nm VCSEL structures. The direct bandgap N-type spacer layer and hole barrier layer have been evaluated in a 850 nm VCSEL. The alternating high- and low-bandgap layers in the N-type Bragg mirror have typically been separated by 20 nm thick linear graded regions of Al composition. In 850 nm VCSELs, the high bandgap mirror layers have been formed from AlAs or Al(0.85)Ga(0.15)As and the low bandgap layers have been Al(0.15)Ga(0.85)As. The linear graded regions have graded the Al fraction from 1.0 to 0.15 or from 0.85 to 0.15 when going from high Al to low Al. For the low to high grades, the Al fraction has been from 0.15 to 1.0 or 0.15 to 0.85. For 1300 nm VCSELs, the high bandgap layers have been AlAs and the low bandgap layers GaAs. In this case, the grades have been from Al fractions of 1.0 to 0.0 and 0.0 to 1.0. Because of the way the electron affinity of the AlGaAs material system changes as a function of Al fraction, the linear graded regions in the N-type mirror cause the conduction band edge to rise between Al fraction of 1.0 (or 0.85) and 0.45 and then fall for Al fractions between 0.45 and 0.0. This rise in the conduction band edge may be between 50.4 meV and 91.5 meV depending on how the available data for AlGaAs bandgap and electron affinity is interpreted. This rise in the conduction band edge may result in an undesirable barrier to electron transport that impedes the flow of majority carrier electrons vertically through the N-type Bragg mirror structure. The present approach may relate to applying electron affinity engineering to achieve a step in Al fraction from indirect bandgap to direct bandgap such that the electron affinity of the material on both sides of the step is the same. This step function in Al fraction may eliminate the undesirable rise in the conduction band edge and thereby facilitate the vertical flow of majority carrier electrons through the N-type Bragg mirror. For Al fractions below 0.45, AlGaAs is a direct bandgap semiconductor; for Al fractions above 0.45 the material is an indirect bandgap semiconductor. The indirect compositions exhibit low electron mobility. There is also an Al fraction range between 0.40 and 0.50 in which the N-type AlGaAs material system is dominated by DX centers which further reduce the number of free electrons and lower the electron mobility. These two effects also impede the vertical flow of electrons through the N-type Bragg mirror over and above the rise in the conduction band edge described above. Applying the indicated step function of Al fraction eliminates both of these effects.

A hole confinement barrier may be implemented by including a narrow layer of N-type AlAs in the N-type barrier layer adjacent to the quantum wells. This indirect AlAs barrier layer would have the same electron affinity as the direct bandgap spacer layer. By doping the hole confinement layer N-type such that the conduction bands are aligned the full AlAs band gap would result in a barrier to holes of 0.318 eV relative to the 25% AlGaAs in the barrier layers. With the past VCSEL designs using an Al fraction of 0.65 in the N-type spacer layer, this hole confinement barrier was only 0.170 eV. Thus, the use of the AlAs hole confinement barrier would give improved hole confinement compared to past designs. The width of the hole confinement barrier may be set to minimize tunneling through the barrier. A hole barrier width of 8–10 nm should be sufficient to confine the holes in the active layer.

In the conduction band, the electrons could cross the barrier both by scattering in and out of the indirect minimum and by tunneling through the r conduction band barrier. Because of the low effective mass of electrons ($m^* \sim 0.1$) in the Γ conduction band and the barrier height of 0.503 eV, the tunneling probability for the electrons will be high so that there should be little impediment to the flow of majority carrier electrons. For the holes, the effective mass is (m*~0.75) and the barrier height of 0.318 eV would confine most of the minority carrier holes in the quantum wells and barriers.

This tunnel barrier appears similar to the effect observed in the poly-silicon emitter structure used on high speed silicon transistors. In that case, the tunnel barrier is a thin oxide layer that freely passes majority carrier electrons and blocks minority carrier holes. In the present device, as noted above, the effect is achieved by engineering the electron affinity in the AlGaAs material system.

The improvement in hole confinement from this tunnel barrier applies when combined with the lower aluminum composition N-type spacer. In that case, it may offset any loss of hole confinement introduced by the lower bandgap of the N-type spacer layer described above. The hole barrier width is less than 10% of the total width of the N-type spacer. As a result, more than 90% of the performance gains associated with the direct bandgap N-type spacer should be achieved.

MOCVD material growth runs were made that included this hole confinement barrier with the reduced aluminum composition in the N-type spacer layer. No undesirable effects were noted in the resulting VCSELs. The greatest potential impact of the hole confinement barrier may be realized at high temperature and high injection levels.

Although the invention has been described with respect to at least one illustrative embodiment, many variations and modifications will become apparent to those skilled in the art upon reading the present specification. It is therefore the intention that the appended claims be interpreted as broadly as possible in view of the prior art to include all such variations and modifications.

What is claimed is:

1. A VCSEL system comprising:
   a substrate;
   a first mirror stack situated on the substrate;
   an active region situated on the first mirror stack;
   a second mirror stack situated on the active region;
   wherein:
      the first mirror stack comprises a plurality of pairs of AlAs and GaAs layers;
      at least one interface of first and second interfaces, is situated between each AlAs layer and GaAs layer;
      the first interface comprises:
         a ramp increase of Al from GaAs to $Al_xGa_{1-x}As$; and
         a step increase of Al from $Al_xGa_{1-x}As$ to $Al_yGa_{1-y}As$; and
      the second interface comprises:
         a step decrease of Al from $Al_yGa_{1-y}A$ to $Al_xGa_{1-x}As$; and
         a ramp decrease of Al from $Al_xGa_{1-x}As$ to GaAs; and
      wherein x ramps to a final value that is $\leq 0.4$ for the first and second interfaces.

2. The system of claim 1, wherein $0.3 \leq x \leq 0.4$; and $0.9 \leq y \leq 1.0$.

3. The system of claim 2, wherein:
   we first mirror stack is a distributed Bragg reflector;
   and the first mirror stack has an N-type doping.

4. The system of claim 3, further comprising a first spacer layer situated between the first mirror stack and the active region.

5. The system of claim 4, wherein:
   the spacer layer comprises $Al_zGa_{1-x}As$;
   $0.3 \leq z \leq 0.4$;
   and the spacer has an N-type doping.

6. The system of claim 5, further comprising a first hole confinement layer situated between the first spacer layer and the active region.

7. The system of claim 6, wherein the first hole confinement barrier comprises AlAs.

8. The system of claim 7, further comprising a transition barrier situated between the hole confinement barrier and the active region.

9. The system of claim 8, wherein the transition barrier comprises:
   a composition of Al that has a ramp variation from $Al_wGa_{1-w}As$ to $Al_vGa_{1-v}As$;
   wherein:
   the $Al_vGa_{1-v}As$ is adjacent to the active region;
   $0.3 \leq w \leq 0.4$; and $0.2 \leq v \leq 0.3$.

10. The system of claim 9, wherein;
    the active region comprises:
       at least one well; and at least one well barrier proximate to the well;
       and the well barrier comprises:
          $Al_uGa_{1-u}As$; and $0.2 \leq u \leq 0.3$.

11. The system of claim 1, wherein:
    $x \approx 0.33$
    $y \approx 1.0$.

12. The system of claim 11, further comprising:
    a first spacer layer situated between the first mirror stack and the active region;
    and wherein the spacer layer comprises:
       $Al_zGa_{1-z}As$; and $z \approx 0.38$.

13. The system of claim 12, further comprising:
    a first hole confinement layer situated between the first spacer layer and the active region; and
    wherein the first hole confinement layer comprises AlAs.

14. The system of claim 13, further comprising:
    a transition barrier situated between the first hole confinement layer and the active region; and wherein:
       the transition barrier comprises a composition of Al that has a ramp variation from $Al_wGa_{1-w}AS$ to $Al_vGa_{1-v}As$;
       the $Al_vGa_{1-v}As$ is adjacent to the active region;
       $w \approx 0.38$; and $v \approx 0.25$.

15. The system of claim 14, wherein the active region comprises:
    at least one well; and at least two well barriers adjacent to the at least one well;
    and wherein:
       the well barrier comprises $Al_uGa_{1-u}As$; and
       $u \approx 0.25$.

16. A VCSEL system comprising:
    a first mirror; and wherein:
       the first mirror comprises a plurality of pairs of layers;
       each pair of layers of the plurality of pairs has a first layer and a second layer;
       the first layer comprises $A_xB_{1-x}C$;
       the second layer comprises $A_yB_{1-y}C$;
       $x+y=1$;
       a transition layer is situated between each first layer and each second layer;
       the transition layer, in a direction of a first layer to a second layer, has a ramp change in content of A from $x=a$ first value of x to a second value of $x=P$, wherein P is less than 0.4, and a step change in content of A from $x=P$ to y;
       the transition layer in a direction of a second layer to a first layer, has a step change in content of A from y to $y=P$ and a ramp change from P to the first value of x.

17. The system of claim 16, further comprising:
a spacer layer situated proximate to the first mirror; and wherein:
the spacer layer comprises $A_zB_{1-z}C$; and $0 \leq z \leq 1$.

18. The system of claim 17, further comprising:
a barrier layer proximate to the spacer layer; and wherein the barrier layer is a hole confinement barrier.

19. The system of claim 18, further comprising:
a transition layer proximate to the barrier layer; and wherein:
the transition layer comprises $A_vB_{1-v}C$;
$0 \leq v \leq 1$; and
v is equal to a value relative to a distance from the barrier layer.

20. The system of claim 19, further comprising:
an active region; and wherein:
the active region comprises at least one quantum well bound by active region barrier layers;
the at least one quantum well comprises $A_wB_{1-w}C$;
the active region barrier layers comprises $A_uB_{1-u}C$;
$0 \leq w \leq 1$; and $0 \leq u \leq 1$.

21. The system of claim 16, wherein:
A is Al;
B is Ga;
and C is As.

22. The system of claim 21, wherein:
$x \approx 0$;
and $y \approx 1$.

23. The system of claim 22, wherein $0.3 \leq P \leq 0.4$.

24. The system of claim 23, wherein:
the ramp change from x to P is approximately linear over a distance between 15 and 25 nm; and the ramp change from P to x is approximately linear over a distance between 15 and 25 nm.

25. The system of claim 24, wherein $z<0.45$.

26. The system of claim 25, wherein the barrier layer comprises AlAs.

27. The system of claim 26, wherein $0.25 \leq v \leq 0.4$.

28. The system of claim 27, wherein $w \approx 1$.

29. The system of claim 28, wherein $0.2<u<0.3$.

30. The system of claim 29, wherein $u \approx 0.25$.

31. The system of claim 30, wherein the first mirror is an N-doped distributed Bragg reflector.

32. The system of claim 31, further comprising a second mirror proximate to the active region.

33. A VCSEL system comprising:
a first mirror; and wherein:
the first mirror comprises a plurality of pairs of layers;
each pair of layers has a first layer and a second layer;
the first layer comprises $A_xC$;
the second layer comprises $A_yC$;
$x+y=1$;
a transition layer is situated between each first layer and a second layer;
the transition layer, in a direction of a first layer to a second layer, has a first change from x to P, and a second change from P to y, wherein $P \leq 0.4$ for the direction of a first layer to a second layer;
the transition layer in a direction of a second layer to a first layer, has a third change from y to P, and fourth change from P to x; and $P \leq 1$ for the direction of a second layer to the first layer.

34. The system of claim 33, wherein:
the first and fourth changes are ramp changes; and the second and third changes are step changes.

35. The system of claim 33, wherein:
the second and third changes are ramp changes; and the first and fourth changes are step changes.

36. The system of claim 34, further comprising:
a spacer layer situated proximate to the first mirror; and the active region; and wherein:
the spacer layer comprises $A_zE$;
the spacer layer is adjacent to the first mirror; and $0 \leq z \leq 1$.

37. A VCSEL system comprising:
a substrate;
a first mirror stack situated on the substrate;
an active region situated on the first mirror stack;
a second mirror stack situated on the active region;
wherein:
the first mirror stack comprises a plurality of pairs of $Al_xGa_{1-x}As$ and $Al_yGa_{1-y}As$ layers;
an interface between each $Al_xGa_{1-x}As$ layer and $Al_yGa_{1-y}As$ layer;
the interface comprises:
at least one linear ramp change of Al composition from x=first value to $x \leq$ a second value, the second value less than 0.4; and at least one step change of Al composition from the second value to a third value.

38. A VCSEL system comprising:
a substrate;
a first mirror stack formed over the substrate, the first mirror having pairs of layers, each pair having a first layer and a second layer;
an active region including a plurality of quantum wells formed over the first mirror stack;
a second mirror stack formed over the active region, the second mirror stack having pairs of layers, each pair including a third layer and a fourth layer;
a first spacer layer between the active region and the first mirror stack and a second spacer layer between the active region and the second mirror stack; and
an interface formed between the first layer and second layer of each pair in the first mirror stack, the interface comprising:
a first portion where a composition of a first element ramps from a first value to a second value, and a step in the composition from the second value to a third value, the second value selected such that electron affinity on a first side of the step is substantially the same as an electron affinity on a second side of the step.

* * * * *